United States Patent
Fenkes et al.

(10) Patent No.: US 8,280,326 B2
(45) Date of Patent: Oct. 2, 2012

(54) RECEIVER COMPRISING A RADIOFREQUENCY SPLITTER

(75) Inventors: Thomas Fenkes, Krefeld (DE); Klaus Bracht, Muelheim (DE)

(73) Assignee: NXP B.V., Eindhoven (NL)

( * ) Notice: Subject to any disclaimer, the term of this patent is extended or adjusted under 35 U.S.C. 154(b) by 870 days.

(21) Appl. No.: 12/297,511

(22) PCT Filed: Apr. 17, 2007

(86) PCT No.: PCT/IB2007/051366
§ 371 (c)(1),
(2), (4) Date: Oct. 17, 2008

(87) PCT Pub. No.: WO2007/119220
PCT Pub. Date: Oct. 25, 2007

(65) Prior Publication Data
US 2009/0131008 A1    May 21, 2009

(30) Foreign Application Priority Data

Apr. 19, 2006  (EP) .................................... 06112772
Apr. 17, 2007  (WO) ................. PCT/IB2007/051366

(51) Int. Cl.
*H04B 1/18*    (2006.01)
(52) U.S. Cl. ............... 455/180.2; 455/188.1; 455/188.2; 455/180.1

(58) Field of Classification Search ............... 455/180.2, 455/180.1, 188.2, 188.1
See application file for complete search history.

(56) References Cited

U.S. PATENT DOCUMENTS

| | | | |
|---|---|---|---|
| 4,760,535 A | 7/1988 | Englmeier | |
| 5,142,371 A | 8/1992 | Lehmann | |
| 6,501,513 B1 | 12/2002 | Nishimura | |
| 6,950,152 B2 * | 9/2005 | Yamamoto | 348/731 |
| 7,139,039 B2 * | 11/2006 | Yamamoto | 348/731 |
| 7,295,251 B2 * | 11/2007 | Yamamoto | 348/731 |
| 2003/0193620 A1 * | 10/2003 | Yamamoto | 348/731 |
| 2004/0063410 A1 | 4/2004 | Pugel | |
| 2005/0110908 A1 | 5/2005 | Yamamoto | |
| 2006/0159208 A1 * | 7/2006 | Naing | 375/345 |

FOREIGN PATENT DOCUMENTS

| | | |
|---|---|---|
| CN | 1058875 A | 2/1992 |
| CN | 1255804 A | 6/2000 |
| DE | 3406150 | 8/1985 |
| GB | 2196198 | 4/1988 |
| WO | WO2005/114854 | 12/2005 |
| WO | PCT/IB2007/051366 | 5/2009 |

* cited by examiner

Primary Examiner — Ryan Jager

(57) ABSTRACT

A receiver comprises a radio frequency splitter and respective tuning elements, which are coupled to respective outputs of the radio frequency splitter One of these tuning elements has a control terminal coupled to receive a direct current control signal via a radio frequency-blocking circuit. A direct current path extends, via the radio frequency splitter, from the aforementioned control terminal to a control terminal of another tuning element.

12 Claims, 2 Drawing Sheets

RECEIVER COMPRISING A RADIOFREQUENCY SPLITTER

FIELD OF THE INVENTION

An aspect of the invention relates to a receiver that comprises a radiofrequency splitter and respective tuning elements, which are coupled to respective outputs of the radiofrequency splitter. The receiver may be, for example, a television apparatus, a settop box, a digital video recorder, a personal computer, or any other entity that is capable of receiving radiofrequency signals. The receiver may also be in the form of, for example, a tuner module for any of such apparatuses. Other aspects of the invention relate to a multimedia system, a method of tuning a receiver, and a computer program product for a programmable processor.

BACKGROUND OF THE INVENTION

A television receiver typically comprises a splitter, which effectively splits a received radiofrequency spectrum into two or more bands. For example, the splitter may effectively split the received radiofrequency spectrum into a UHF band, a lower VHF band, and a higher VHF band. Each band has a dedicated processing branch with a front portion. The front portion is coupled to a particular output of the splitter, which is associated with the band concerned. The front portion generally comprises a tuning element that forms part of a resonance circuit. The tuning element is typically in the form of a tuning diode, which receives one or more tuning voltages for tuning the resonance circuit. For example, the tuning diode may receive a coarse-tuning voltage at a cathode and a fine-tuning voltage at an anode.

A tuning diode in the front portion of a processing branch typically receives a tuning voltage from a tuning voltage source via a tuning voltage path. The tuning voltage path may be in the form of, for example, a copper track on a printed circuit board. The tuning voltage path has several branches, one for each processing branch so as to bring the tuning voltage close to the tuning diode in the front portion of that processing branch. Each tuning diode receives the tuning voltage via a radiofrequency-blocking circuit that is coupled between, on the one hand, a control terminal of the tuning diode and, on the other hand, the branch of the tuning voltage path that brings the tuning voltage to close to the tuning diode.

United States patent application published under number 2004/0063410 describes an electronic alignment system for a television signal tuner. Radiofrequency signals are input to a UHF/VHF splitter that is operative to separate the UHF band from the VHF band. A single tuned filter within a UHF processing portion receives UHF signals from the UHF/VHF splitter. A voltage signal allows this single tuned filter to tune to a selected UHF channel. Similarly, a single tuned filter within a VHF processing portion receives VHF signals from the UHF/VHF splitter. A voltage signal allows this single tuned filter to tune to a selected VHF channel.

SUMMARY OF THE INVENTION

It is an object of the invention to allow satisfactory radiofrequency signal processing at moderate cost. The independent claims define various aspects of the invention. The dependent claims define additional features for implementing the invention to advantage.

In accordance with the invention, a receiver comprises a radiofrequency splitter and respective tuning elements, which are coupled to respective outputs of the radiofrequency splitter. One of these tuning elements has a control terminal coupled to receive a direct current control signal via a radiofrequency-blocking circuit. A direct current path extends, via the radiofrequency splitter, from the aforementioned control terminal to a control terminal of another tuning element.

Accordingly, the direct current control signal, which the one tuning element receives via the radiofrequency-blocking circuit, reaches the other tuning element via the radiofrequency splitter. Consequently, there is no need for a further radiofrequency-blocking circuit in order to apply the direct current control signal to the other tuning element. Such a further radiofrequency-blocking circuit would be needed for applying the direct current control signal to the other tuning element, if the direct current path, which traverses the splitter, did not exist. The invention thus allows implementations in which a single radiofrequency-blocking circuit provides the necessary radiofrequency isolation for applying the direct current control signal to several different tuning elements. For this reason alone, the invention allows cost-efficient implementations.

What is more, a control signal path, which extends from a control signal source to the one tuning element, does not need to have any branches. Such branches would be required if the direct current path, which traverses the splitter, did not exist. The invention allows a control signal path in the form of, for example, a simple copper track on a printed circuit board, without any branches. This saves space and simplifies design, which contributes to lowering cost.

Another advantage of the invention relates to the following aspects. In practice, distinct electrical connections, which may be in the form of copper tracks on a printed circuit board, are electromagnetically coupled to a certain extent. In many cases, this coupling is undesired and therefore referred to as parasitic coupling. In a radiofrequency design, each additional electrical connection introduces a risk that electrical properties of other electrical connections and circuits coupled thereto are significantly modified. Moreover, each additional electrical connection introduces an additional risk that a signal leaks from one to another circuit in a significant manner, and vice versa. This is often referred to as crosstalk. The invention allows a control signal path without any branches. Consequently, there is less risk of parasitic coupling and crosstalk, which contributes to a satisfactory radiofrequency processing.

An implementation of the invention advantageously comprises one or more of the following additional features, each of which contributes to satisfactory radiofrequency signal processing at moderate cost. Different sets of additional features, which correspond with different dependent claims, are presented as different paragraphs.

The one and the other tuning element preferably each comprise two control terminals. One control terminal receives a coarse-tuning voltage. The other control terminal receives a fine-tuning voltage. These features allow precise filtering of a selected channel.

The fine-tuning voltage preferably constitutes the direct current control signal, which the direct current path transfers from the control terminal of the one tuning element to the control terminal of the other tuning element. This feature contributes to lowering cost.

The one and the other tuning element preferably are each a tuning diode having a cathode coupled to receive the coarse-tuning voltage and an anode coupled to receive the fine-tuning voltage. This feature contributes to lowering cost.

The direct current path preferably comprises a resistance, which is coupled between an input and an output of the radiofrequency splitter, and an inductance, which is coupled between the input of the radiofrequency splitter and another output of the radiofrequency splitter. This feature contributes to satisfactory radiofrequency signal processing.

The respective tuning elements preferably belong to respective processing branches, which are coupled between the respective outputs of the radiofrequency splitter and a mixer oscillator. This feature contributes to satisfactory radiofrequency signal processing.

The receiver preferably comprises a tuning voltage generator that generates the coarse-tuning voltage on the basis of a tuning command, a reference frequency, and an oscillator frequency from a mixer oscillator. The receiver further preferably comprises a controller that provides the fine-tuning voltage on the basis of correction data, which is stored in a memory. These features contribute to precise filtering of a selected channel, even if components suffer from tolerances.

A detailed description with reference to drawings illustrates the invention summarized hereinbefore, as well as the additional features.

DETAILED DESCRIPTION

Figure 1:
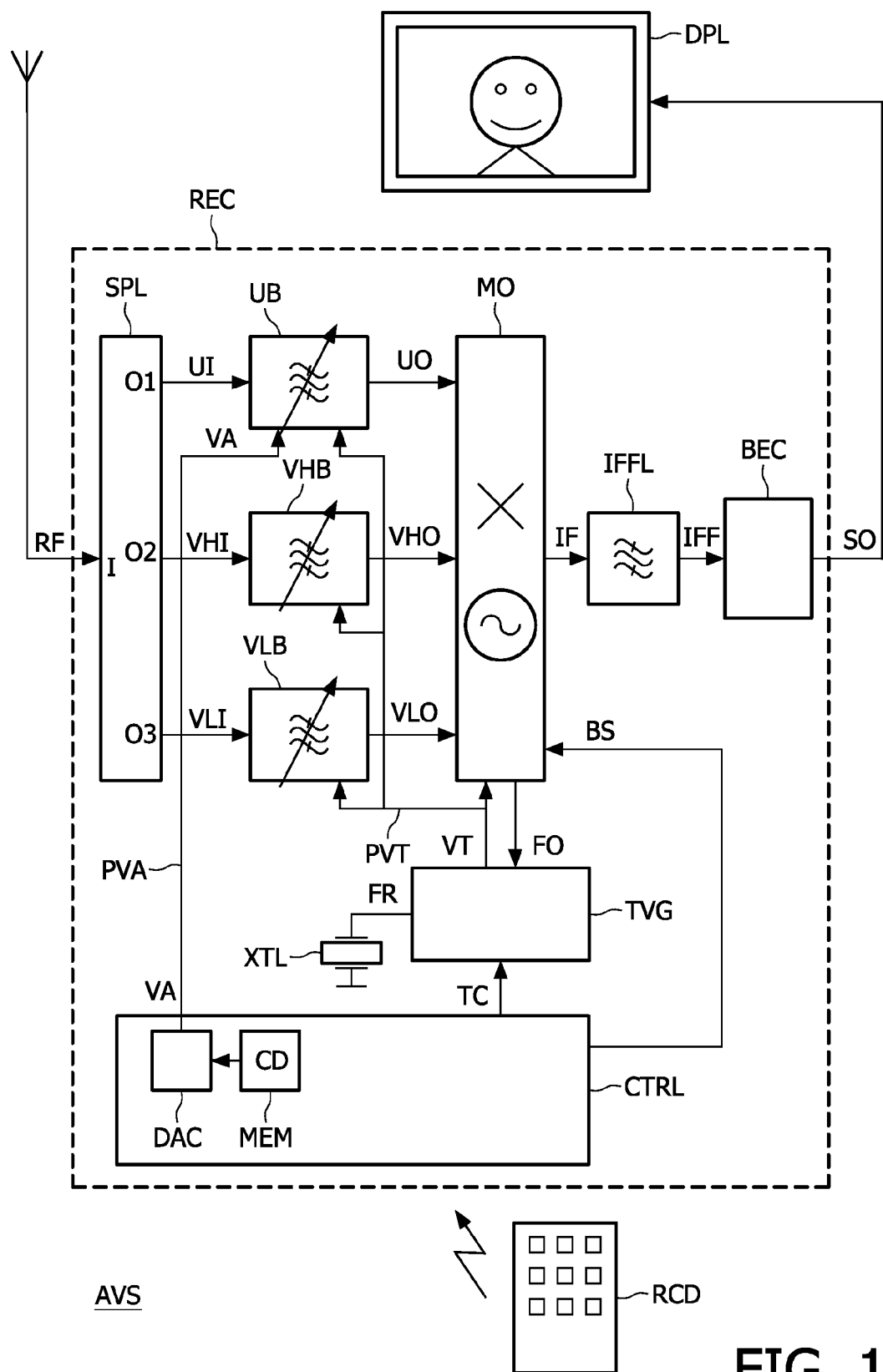
FIG. 1 is a block diagram that illustrates an audiovisual system, which comprises a receiver.

FIG. 1 illustrates an audiovisual system AVS. The audiovisual system AVS comprises a display device DPL, a receiver REC, and a remote-control device RCD. The receiver REC derives an audiovisual signal SO from a selected channel within a received radiofrequency spectrum RF. The display device DPL renders the audiovisual signal SO. The selected channel may be any channel in three different television bands: a UHF band, a higher VHF band, and a lower VHF band (UHF is an acronym for ultra high frequency; VHF is an acronym for very high frequency).

The receiver REC comprises various functional entities that process radiofrequency signals: a splitter SPL, a UHF processing branch UB, a higher VHF processing branch VHB, a lower VHF processing branch VLB, a mixer-oscillator MO, and a tuning voltage generator TVG, which is coupled to a crystal element XTL. These functional entities may be implemented by means of, for example, one or more integrated circuits and various discrete components inside a tin can housing, which is often referred to as tuner module. The receiver REC further comprises an intermediate frequency filter IFFL, a backend circuit BEC, and a controller CTRL, which includes a memory MEM and a digital-to-analog converter DAC. The controller CTRL may be in the form of, for example, a suitably programmed processor.

The receiver REC basically operates as follows. The splitter SPL effectively separates channels within the received radiofrequency spectrum RF according to the three different television bands. The splitter SPL has a radio frequency input I and three outputs O1, O2, and O3, one for each of the three different television bands. The UHF processing branch UB receives a UHF input spectrum UT from output O1 of the splitter SPL. Similarly, the higher VHF processing branch VHB and the lower VHF processing branch VLB receive a higher VHF input spectrum VHI and a lower VHF input spectrum VLI from outputs O2 and O3 of the splitter SPL, respectively.

The UHF processing branch UB applies a processed UHF spectrum UO to the mixer-oscillator MO. The processed UHF spectrum UO is a filtered and amplified version of the UHF input spectrum UT at output of the splitter SPL. Similarly, the higher VHF processing branch VHB and the lower VHF processing branch VLB apply a processed higher VHF spectrum VHO and a processed lower VHF spectrum VLO, respectively, to the mixer-oscillator MO. One of the aforementioned processed spectra comprises the selected channel.

The mixer-oscillator MO converts the processed spectrum that comprises the selected channel into an intermediate frequency spectrum IF. The intermediate frequency filter IFFL filters the intermediate frequency spectrum IF so as to obtain a filtered intermediate frequency spectrum IFF, which substantially comprises a frequency-shifted version of the selected channel within the received radiofrequency spectrum RF. Other channels are suppressed to relatively great extent. The backend circuit BEC derives the audiovisual signal SO from the filtered intermediate frequency spectrum IFF. To that end, the backend circuit BEC may carry out various operations, such as, for example, amplification, demodulation, decoding, and baseband processing.

Let it be assumed that a user depresses a button on the remote-control device RCD so as to select a particular channel. The remote-control device RCD signals this event to the controller CTRL. In response, the controller CTRL applies a band-select command BS to the mixer-oscillator MO and a tuning command TC to the tuning voltage generator TVG. The band-select command BS indicates whether the selected channel lies within the UHF band, the higher VHF band, or the lower VHF band. Accordingly, the mixer-oscillator MO converts the processed UHF spectrum UO, the processed higher VHF spectrum VHO, or the processed lower VHF spectrum VLO, respectively, into the intermediate frequency spectrum IF. The tuning command TC indicates a desired oscillator frequency in terms of a ratio with a reference frequency FR, which the crystal element XTL provides.

The tuning voltage generator TVG generates a tuning voltage VT that causes an oscillator frequency FO within the mixer-oscillator MO to be equal to the desired oscillator frequency. The tuning voltage generator TVG may do so by means of, for example, a frequency synthesis loop. The desired channel within the intermediate frequency spectrum IF coincides with a pass band of the intermediate frequency filter IFFL if the oscillator frequency FO within the mixer-oscillator MO is equal to the desired oscillator frequency.

The UHF processing branch UB, the higher VHF processing branch VHB, and the lower VHF processing branch VLB, receive the tuning voltage VT from the tuning voltage generator TVG via a tuning voltage path PVT, which extends from the tuning voltage generator TVG to each of the aforementioned processing branches. The UHF processing branch UB has a pass band that varies as a function of the tuning voltage VT. The same applies to the higher VHF processing branch VHB and the lower VHF processing branch VLB. Only one of these processing branches is relevant depending on whether the selected channel lies within the UHF band, the higher VHF band, or the lower VHF band.

Ideally, the tuning voltage VT should cause the pass band of the relevant processing branch to coincide with the selected channel. Any of the processing branches may be the relevant processing branch because the selected channel may lie within any of the aforementioned bands. Moreover, any channel within the aforementioned bands may be the selected channel.

Accordingly, the pass band of each processing branch should preferably vary with the tuning voltage VT according to a specific function. This specific function should guarantee that the pass band of the relevant processing branch coincides with the selected channel irrespective of which channel is the desired channel. This implies a precise alignment of the pass band with respect to the oscillator frequency FO within the mixer-oscillator MO. Component tolerances, aging, temperature variations, and other effects may cause alignment errors: the pass band may not precisely coincide with the selected channel.

The UHF processing branch UB receives an alignment voltage VA from the controller CTRL via an alignment voltage path PVA, which extends from the controller CTRL to the UHF processing branch UB. The alignment voltage VA compensates for alignment errors, if any. The alignment voltage VA fine-tunes, as it were, the UHF processing branch UB so that the pass band coincides with the selected channel if this channel lies within the UHF band.

The controller CTRL generates the alignment voltage VA on the basis of correction data CD, which stored in the memory MEM illustrated in FIG. 1. The correction data CD may comprise various correction values, each of which belongs to a particular channel or a particular group of channels. The controller CTRL selects a particular correction value, which belongs to the selected channel. The digital-to-analog converter DAC converts that particular correction value into the alignment voltage VA. The correction data CD may be established and subsequently written into the memory MEM during, for example, a manufacturing process or during a separate customization process.

The alignment voltage VA reaches the higher VHF processing branch VHB and the lower VHF processing branch VLB via the splitter SPL. That is, the UHF processing branch UB passes the alignment voltage VA to output O1 of the splitter SPL to which the aforementioned processing branch is coupled. The splitter SPL passes the alignment voltage VA from output O1 to outputs O2 and O3, to which the higher VHF processing branch VHB and the lower VHF processing branch VLB are coupled, respectively. The alignment voltage VA thus also fine-tunes these branches in a manner similar to that described hereinbefore with respect to the UHF processing branch UB.

Figure 2:
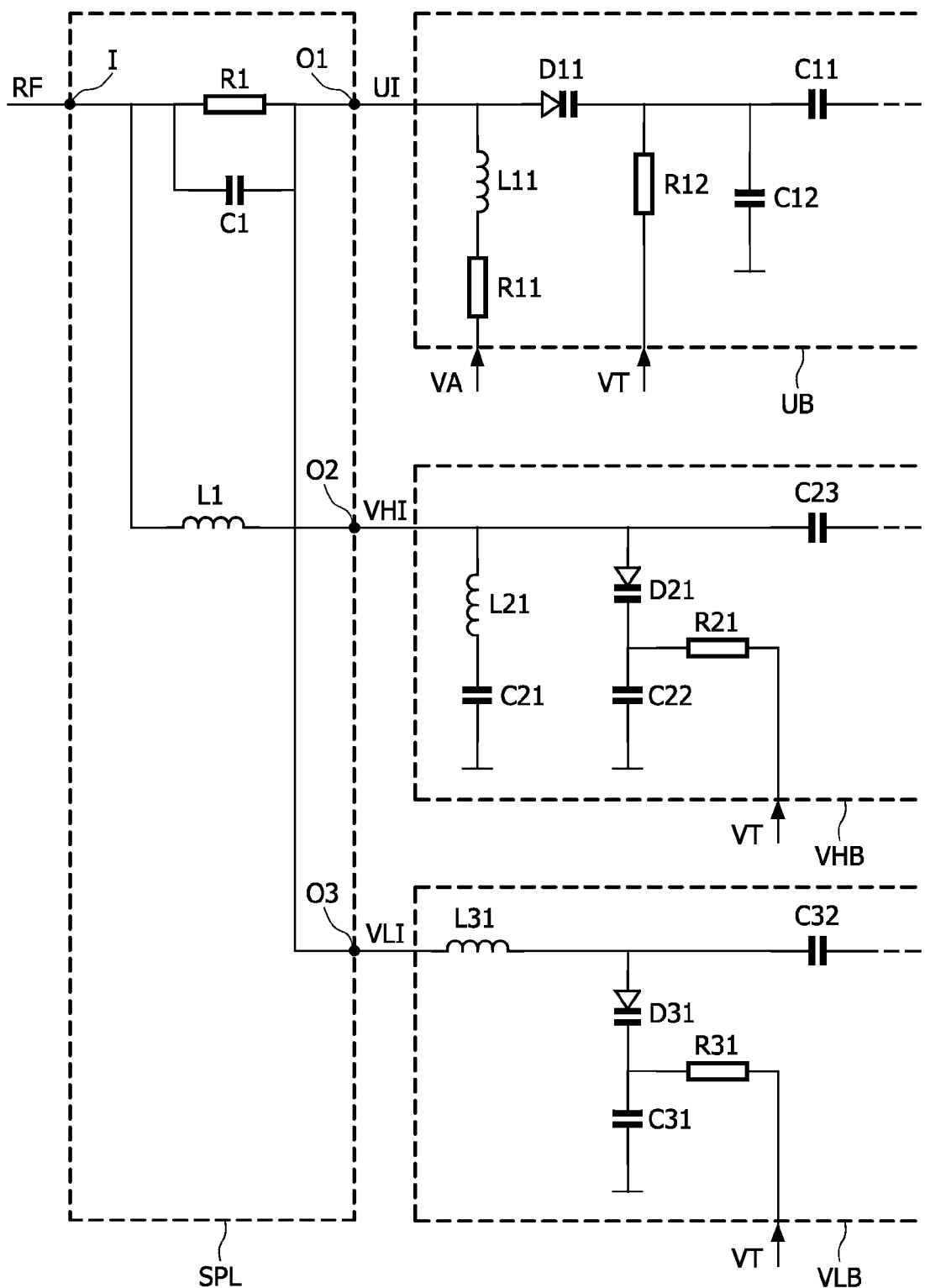
FIG. 2 is a circuit diagram that illustrates a splitter and respective tuning elements for respective reception bands, which form part of the receiver.

FIG. 2 illustrates an implementation of the splitter SPL and an implementation of respective front portions of the UHF processing branch UB, the higher VHF processing branch VHB, and the lower VHF processing branch VLB. These implementations will be referred to hereinafter as splitter circuit, UHF input circuit, higher VHF input circuit, and lower VHF input circuit, respectively. The splitter circuit comprises a resistance R1, a capacitance C1, and an inductance L1.

The aforementioned input circuits, UHF, higher VHF, and lower VHF, each comprise a tuning diode: tuning diodes D11, D21, and D31, respectively. These tuning diodes will be referred to hereinafter as UHF tuning diode D11, higher VHF tuning diode D21, and lower VHF tuning diode D31, respectively. Each tuning diode has a cathode and an anode. The aforementioned input circuits further comprise various other elements: inductances L11, L21, L31, capacitances C11, C12, C21, C22, C23, C31, C32 and resistances R11, R12, R21, R31. These elements are denoted by reference signs that comprise a most significant digit and a least significant digit. The most significant digit of an element is equal to 1, 2, or 3 depending on whether the element belongs to the UHF input circuit, the higher VHF input circuit, or the lower VHF input circuit, respectively.

The UHF tuning diode D11 receives the tuning voltage VT at its cathode via resistance R12. The UHF tuning diode D11 further receives the alignment voltage VA at its anode via resistance R11 and inductance L11. Accordingly, a difference voltage is present between the cathode and the anode of the UHF tuning diode D11. The difference voltage is substantially equal to the tuning voltage VT minus the alignment voltage VA. The tuning voltage VT may vary within a relatively wide range comprised between, for example, 0 and 30 volts. The alignment voltage VA may vary within a relatively small range comprised between, for example, 0 and 5 volts.

The UHF tuning diode D11 forms part of a UHF resonance circuit, which has a resonance frequency that varies as a function of the difference voltage between the cathode and the anode. Consequently, the resonance frequency varies as a function of the tuning voltage VT as well as a function of the alignment voltage VA. As explained hereinbefore, the tuning voltage generator TVG illustrated in FIG. 1 controls the tuning voltage VT so that the oscillator frequency FO within the mixer-oscillator MO is equal to the desired oscillator frequency, which the tuning command TC indicates. The UHF resonance circuit in the UHF processing branch UB has no control over the tuning voltage VT and receives this voltage "as is". The tuning voltage VT provides a coarse tuning of the UHF resonance circuit. The alignment voltage VA, which provides a fine tuning, ensures that the resonance frequency corresponds with the selected channel.

The aforementioned difference voltage is equally present between the higher VHF tuning diode D21 and the lower VHF tuning diode D31. More specifically, the higher VHF tuning diode D21 receives the tuning voltage VT at its cathode via resistance R21. The higher VHF tuning diode D21 further receives the alignment voltage VA via a direct current path that extends from the cathode of the UHF tuning diode D11 to the cathode of the higher VHF tuning diode D21. The resistance R1 and the inductance L1 in the splitter circuit, which are coupled between output O1 and output O2, forms part of this direct current path, which passes the aforementioned outputs. Thanks to this direct current path, the difference voltage, which is present between the cathode and the anode of the UHF tuning diode D11, is also present between the cathode and the anode of the higher VHF tuning diode D21.

The lower VHF tuning diode D31 receives the tuning voltage VT at its cathode via resistance R31. The lower VHF tuning diode D31 further receives the alignment voltage VA via a direct current path that extends from the cathode of the UHF tuning diode D11 to the cathode of the lower VHF tuning diode D31. A connection in the splitter circuit, which is present between output O1 and output O3, forms part of this direct current path, which passes the aforementioned outputs. The direct current path further includes inductance L31 of the lower VHF input circuit. Thanks to this direct current path, the difference voltage, which is present between the cathode and the anode of the UHF tuning diode D11, is also present between the cathode and the anode of the lower VHF tuning diode D31.

The higher VHF tuning diode D21 and the lower VHF tuning diode D31 form part of a higher VHF resonance circuit and a lower VHF resonance circuit, respectively, each of which has a particular resonance frequency. These tuning diodes receive the alignment voltage VA via the respective direct current paths, which traverse the splitter circuit as described hereinbefore. Consequently, the alignment voltage VA can fine-tune the higher VHF resonance circuit and the lower VHF resonance circuit so as to reduce alignment errors, if any.

Resistances R12, R21, and R31 provide radiofrequency isolation. These resistances effectively prevent radiofrequency signals, which may be present on the respective cathodes of the tuning diodes D11, D21, and D31, from flowing to the tuning voltage path PVT illustrated in FIG. 1. Inductance L11 and resistance R11 also provide radiofrequency isolation. These elements effectively prevent a radiofrequency signal, which is present on the anode of UHF tuning diode D11, from flowing to the alignment voltage path PVA illustrated in FIG. 1. Inductance L11 and resistance R11 thus constitutes a radiofrequency-blocking circuit. The same applies to resistances R12, R21, and R31.

Since the alignment voltage VA reaches the higher VHF tuning diode D21 and the lower VHF tuning diode D31 via the splitter circuit, there is no need for specific elements that provide radiofrequency isolation between the respective anodes of these tuning diodes and the alignment voltage path PVA. Such radiofrequency-blocking elements would be required if the aforementioned direct current paths, which transfer the alignment voltage VA to the aforementioned tuning diodes, did not exist. In contrast, in FIG. 2, inductance L11 and resistance R11 provide the necessary radiofrequency isolation for applying the alignment voltage VA to the higher VHF tuning diode D21 and the lower VHF tuning diode D31. Consequently, alignment errors in these processing branches can be prevented at moderate cost.

What is more, the alignment voltage path PVA only needs to extend between the UHF processing branch UB and the controller CTRL, as illustrated in FIG. 1. There is no need for any branches in the alignment voltage path PVA, which would otherwise be required if the aforementioned direct current paths did not exist. For example, the alignment voltage path PVA may be a simple copper track, printed circuit board, without any branches. This saves space and simplifies design, which contributes to lowering cost. Moreover, there is less risk of parasitic coupling and crosstalk.

CONCLUDING REMARKS

The detailed description hereinbefore with reference to the drawings is merely an illustration of the invention and the additional features, which are defined in the claims. The invention can be implemented in numerous different manners. In order to illustrate this, some alternatives are briefly indicated.

The invention may be applied to advantage in any type of product or method that involves a radiofrequency splitter and respective tuning elements, which are coupled to respective outputs of the splitter. The audiovisual system AVS illustrated in FIG. 1 is merely an example. The invention may equally be applied to advantage in, for example, a multiband communication apparatus. That is, a radiofrequency signal that the radiofrequency splitter receives need not necessarily convey audio and video information. The radiofrequency signal may convey any type of information, such as, for example, a text file.

The invention may be applied to advantage in numerous different receiver concepts. FIGS. 1 and 2 merely illustrates an example that concerns television reception by means of three processing branches, one for the UHF band, one for the higher VHF band, and one for the lower VHF band. This is a so-called three-band concept. Other implementations may comprise a different number of processing branches. For example, the invention may equally be applied in a two-band concept.

There are numerous different types of direct current control signals that may be transferred from one tuning element to another tuning element via a direct current path, which traverses a radiofrequency splitter. FIGS. 1 and 2 merely illustrate an example in which the alignment voltage VA, which is a fine-tuning voltage, is transferred in this manner. In another implementation, a coarse-tuning voltage may be transferred in this manner.

An example another implementation can be indicated with reference to FIG. 2. The tuning diodes D11, D21, and D31 can inversely be coupled so that the cathode of the UHF tuning diode D11 is coupled to output of the splitter SPL. In that case, the tuning voltage VT can be applied to the cathode of the UHF tuning diode D11 via resistance R11 and inductance L11. The tuning voltage VT will reach the respective cathodes of the higher VHF tuning diode D21 and the lower VHF tuning diode D31 via the splitter SPL. The respective anodes of the tuning diodes D11, D21, and D31 may receive the alignment voltage VA via resistances R12, R21, and R31, respectively. A fixed biasing voltage may replace the alignment voltage VA.

There are numerous different manners of implementing a radiofrequency splitter SPL in accordance with the invention. FIG. 2 merely illustrates an example that comprises relatively few elements. Further elements may be added, or arranged differently, or both. For example, referring to FIG. 2, an additional inductance may be coupled between output O1 and output O3 of the splitter SPL. An additional capacitance may also be introduced. An additional inductance or an additional resistance may be coupled in parallel with this additional capacitance in order to maintain a direct current path between respective outputs of the splitter SPL.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. A receiver comprising:
   a radiofrequency splitter;
   respective tuning elements that are coupled to receive respective outputs of the radiofrequency splitter, one of the respective tuning elements having a control terminal coupled to receive a direct current control signal via a radiofrequency-blocking circuit; and
   a direct current path that extends, via the radiofrequency splitter, from the aforementioned control terminal to a control terminal of another tuning element.

2. A receiver according to claim 1, the one and the other tuning element each comprising two control terminals, one being coupled to receive a coarse-tuning voltage, the other control terminal being coupled to receive a fine-tuning voltage.

3. A receiver according to claim 2, the fine-tuning voltage constituting the direct current control signal, which the direct current path transfers from the control terminal of the one tuning element to the control terminal of the other tuning element.

4. A multimedia system comprising a receiver according to claim 1 for deriving a multimedia signal from a selected channel in a radiofrequency spectrum, and a rendering device for rendering the multimedia signal.

5. A receiver according to claim 1, further including a controller and memory, wherein the controller is configured and arranged to generate the direct current control signal based on correction data stored in the memory.

6. A receiver according to claim 1, wherein the direct current control signal is configured and arranged to reduce alignment errors between a higher VHF resonance circuit and a lower VHF resonance circuit of the radiofrequency splitter.

7. A receiver comprising:
a radiofrequency splitter;
respective tuning elements that are coupled to respective outputs of the radiofrequency splitter, one of the respective tuning elements having a control terminal coupled to receive a direct current control signal via a radiofrequency-blocking circuit, each tuning element including two control terminals, one being coupled to receive a coarse-tuning voltage, the other control terminal being coupled to receive a fine-tuning voltage, and each tuning element being a tuning diode having a cathode coupled to receive the coarse-tuning voltage and an anode coupled to receive the fine-tuning voltage; and
a direct current path that extends, via the radiofrequency splitter, from the aforementioned control terminal to a control terminal of another tuning element.

8. A receiver comprising:
a radiofrequency splitter;
respective tuning elements that are coupled to respective outputs of the radiofrequency splitter, one of the respective tuning elements having a control terminal coupled to receive a direct current control signal via a radiofrequency-blocking circuit; and
a direct current path that extends, via the radiofrequency splitter, from the aforementioned control terminal to a control terminal of another tuning element, the direct current path including a resistance coupled between an input and an output of the radiofrequency splitter; and an inductance coupled between the input of the radiofrequency splitter and another output of the radiofrequency splitter.

9. A receiver comprising:
a radiofrequency splitter;
respective tuning elements that are coupled to respective outputs of the radiofrequency splitter, one of the respective tuning elements having a control terminal coupled to receive a direct current control signal via a radiofrequency-blocking circuit; and
a direct current path that extends, via the radiofrequency splitter, from the aforementioned control terminal to a control terminal of another tuning element, the respective tuning elements belonging to respective processing branches, which are coupled between the respective outputs of the radiofrequency splitter and a mixer-oscillator.

10. A receiver comprising:
a radiofrequency splitter;
respective tuning elements that are coupled to respective outputs of the radiofrequency splitter, one of the respective tuning elements having a control terminal coupled to receive a direct current control signal via a radiofrequency-blocking circuit, each tuning element including two control terminals, one being coupled to receive a coarse-tuning voltage, the other control terminal being coupled to receive a fine-tuning voltage;
a direct current path that extends, via the radiofrequency splitter, from the aforementioned control terminal to a control terminal of another tuning element;
a tuning voltage generator for generating the coarse-tuning voltage on the basis of a tuning command, a reference frequency, and an oscillator frequency from a mixer-oscillator; and
a controller arranged to provide the fine-tuning voltage on the basis of correction data, which is stored in a memory.

11. A method of tuning a receiver that comprises:
a radiofrequency splitter;
respective tuning elements, which are coupled to receive respective outputs of the radiofrequency splitter, one of the respective tuning elements having a control terminal coupled to receive a direct current control signal via a radiofrequency-blocking circuit; and
a direct current path that extends, via the radiofrequency splitter, from the aforementioned control terminal to a control terminal of another tuning element;
the method comprising the step of:
controlling the respective tuning elements by applying the direct current control signal to the control terminal of the one tuning element.

12. A non-transitory medium computer program product for a programmable processor, the computer program product comprising a set of instructions that, when loaded into the programmable processor, causes the programmable processor to carry out the method according to claim 11.

* * * * *